(12) United States Patent
Goh

(10) Patent No.: US 6,408,507 B1
(45) Date of Patent: Jun. 25, 2002

(54) HEAT SINK TO SEMICONDUCTOR MODULE ASSEMBLY EQUIPMENT AND METHOD

(75) Inventor: Seok Goh, Cheon-an (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 26 days.

(21) Appl. No.: 09/715,627

(22) Filed: Nov. 17, 2000

(30) Foreign Application Priority Data

Nov. 17, 1999 (KR) .......................................... 99-51106

(51) Int. Cl.[7] ................................................ H05K 3/30
(52) U.S. Cl. ............................ 29/832; 29/830; 29/832; 29/840; 29/564; 29/564.1; 29/564.6
(58) Field of Search ........................... 29/830, 832, 564, 29/564.1, 564.6, 840

(56) References Cited

U.S. PATENT DOCUMENTS 4,236,301 A * 12/1980 Hug et al .................. 29/544.6
5,619,794 A * 4/1997 Hokazono .................. 29/564.6
5,804,872 A * 9/1998 Miyano et al. ............... 29/741

* cited by examiner

Primary Examiner—Carl J. Arbes
(74) Attorney, Agent, or Firm—Skjerven Morrill LLP; David W. Heid

(57) ABSTRACT

Automated equipment mounts heat sinks on printed circuit boards. First heat sinks, semiconductor modules and second heat sinks are consecutively seated on a plurality of built-up pads as the built-up pads move from station to station around a built-up pad conveyer. Rivets are mounted in a first heat sink and inserted through holes in a semiconductor module and a second heat sink when seating the semiconductor module and the second heat sink. Working the rivets fixes the first heat sink, the semiconductor module and the second heat sink permanently, and thereby forms a semiconductor product. After that, a label is attached on the semiconductor product and the riveting quality and the labeling quality of the semiconductor product are inspected.

15 Claims, 9 Drawing Sheets

HEAT SINK TO SEMICONDUCTOR MODULE ASSEMBLY EQUIPMENT AND METHOD

BACKGROUND OF THE INVENTION

1. Field of the Invention

The present invention relates to methods and equipment for assembling heat sinks and semiconductor modules.

2. Description of the Related Art

Improvements in compact semiconductor modules have played an important role in improving the performance and reducing the sizes of devices used or manufactured in many industries. For example, common central processing units (CPUs), which typically operated at about 1 MHz when first in widespread use, now typically operate processing speeds between 500 MHz and 1 GHz. Similarly, common semiconductor modules for memory systems initially had a storage capacity of about 48 Kbyte but now commonly provide a storage capacity of 1 Gbyte.

As the storage capacity of the semiconductor module designs increased, the typical access speed improved to about 8 to 10 nsec from hundreds of nanoseconds. When compared with operating speeds of information processing systems (e.g., CPUs), the processing speeds of memory systems have not increased in the same proportions. This has caused trouble in maximizing the performance of information processing systems. One attempt to solve these problems and maximize the performance of the information processing system uses a relatively fast cache memory. However, cache memories still have several drawbacks.

Lately, so-called "RAMBUS DRAM®" (a trademark of Rambus Corporation)" has been developed to improve the performance of memories generally. The Rambus DRAM has a high efficiency of 95% and a processing speed of 1.6 nsec, which is four times processing speed of "Sync Link DRAM (SLDRAM) of 400 Mbyte/sec" otherwise known as the most rapid semiconductor module.

A semiconductor module containing memory chips operating at high speed has a weakness in that the module is susceptible to damage from external shock because of the semiconductor chips are mounted on a base plate in a flip-chip configuration to reduce the size of the semiconductor module.

Additionally, the wiring width and the wiring interval of inside signal lines of the semiconductor chips must be small to obtain a high level of integration and rapid processing speed. The narrow wiring width increases the internal intrinsic resistance, so that operation of the memory chips generates lots of heat. Therefore, in general, semiconductor products operating at high speed must rapidly radiate heat to prevent degradation of performance or damage to the products. To protect the semiconductor chips and achieve the necessary heat radiation from a semiconductor module operating at high speed, heat sinks, which have a prescribed strength and a high thermal conductivity, are mounted, for example, riveted on the semiconductor module. The heat sink must be mounted on or surrounding the semiconductor chips of the semiconductor module and commonly use materials such as an aluminum alloy that has a high thermal conductivity. After a rivet protruding is inserted through aligned holes in a printed circuit board and the heat sink, a punch deforms the rivet to stably combine the printed circuit board and the heat sink.

SUMMARY OF THE INVENTION

Some embodiments of the present invention provide methods and automated equipment for assembling heat sinks on semiconductor modules. One embodiment of the equipment includes a plurality of built-up pads that receive heat sinks and semiconductor modules while from station to station around a loop. The equipment rivets the heat sinks and the semiconductor modules together using a rivet that was provided in a first heat sink on a built-up pad. At a last station on the loop, the equipment inspects the rivets and a label to determine whether the finished semiconductor module is good or bad.

In one exemplary embodiment of the present invention, the equipment comprises: a base body; a built-up pad conveying unit; a first heat sink supply unit; a semiconductor module unloading unit; a second heat sink supply unit; a riveting unit; a semiconductor product loading unit; and a tray conveying unit. The built-up pad conveying unit is mounted at the upper center of the base body and contains a plurality of built-up pads for assembly of heat sinks and semiconductor modules. The first heat sink supply unit seats the first heat sink, in which a rivet is mounted, on one of the built-up pads. The semiconductor module unloading unit seats the semiconductor module from a tray, on the first heat sink on the built-up pad, with the rivet of the first heat sink through a matching hole in the semiconductor module. The second heat sink supply unit seats a second heat sink onto the semiconductor module with the rivet inserted through a hole in the second heat sink, after the built-up pad with the combined first heat sink and semiconductor module is transferred one step. The riveting unit works an end of the rivet to rivet the first heat sink, the semiconductor module, and the second heat sink together after the built-up pad is transferred another step. After the riveting, the semiconductor product loading unit loads the semiconductor products on the tray. The tray conveying unit transfers trays from the semiconductor module unloading unit to the semiconductor product loading unit.

Another embodiment of the present invention, is a method for assembling heat sink to semiconductor module. The method comprises: seating a first heat sink, on which a rivet is mounted, on a built-up pad of a built-up pad conveying unit and transferring the built-up pad one step; seating a semiconductor module transferred from a tray onto the first heat sink with the rivet through a hole in the semiconductor module and transferring the built-up pad another step; seating a second heat sink on the semiconductor module with the rivet through a hole in the second heat sink and transferring the built-up pad another step; deforming the rivet to attach and fix the semiconductor module and the heat sinks and transferring the built-up pad another step; and unloading the semiconductor modules from the built-up pad, onto an empty tray after unloading all of the semiconductor modules from the tray.

BRIEF DESCRIPTION OF THE DRAWINGS

Further aspects and advantages of the invention can be more fully understood from the following detailed description taken in conjunction with the accompanying drawings in which.

Use of the same reference symbols in different figures indicates similar or identical items.

DETAILED DESCRIPTION OF THE PREFERRED EMBODIMENT

Figure 1:
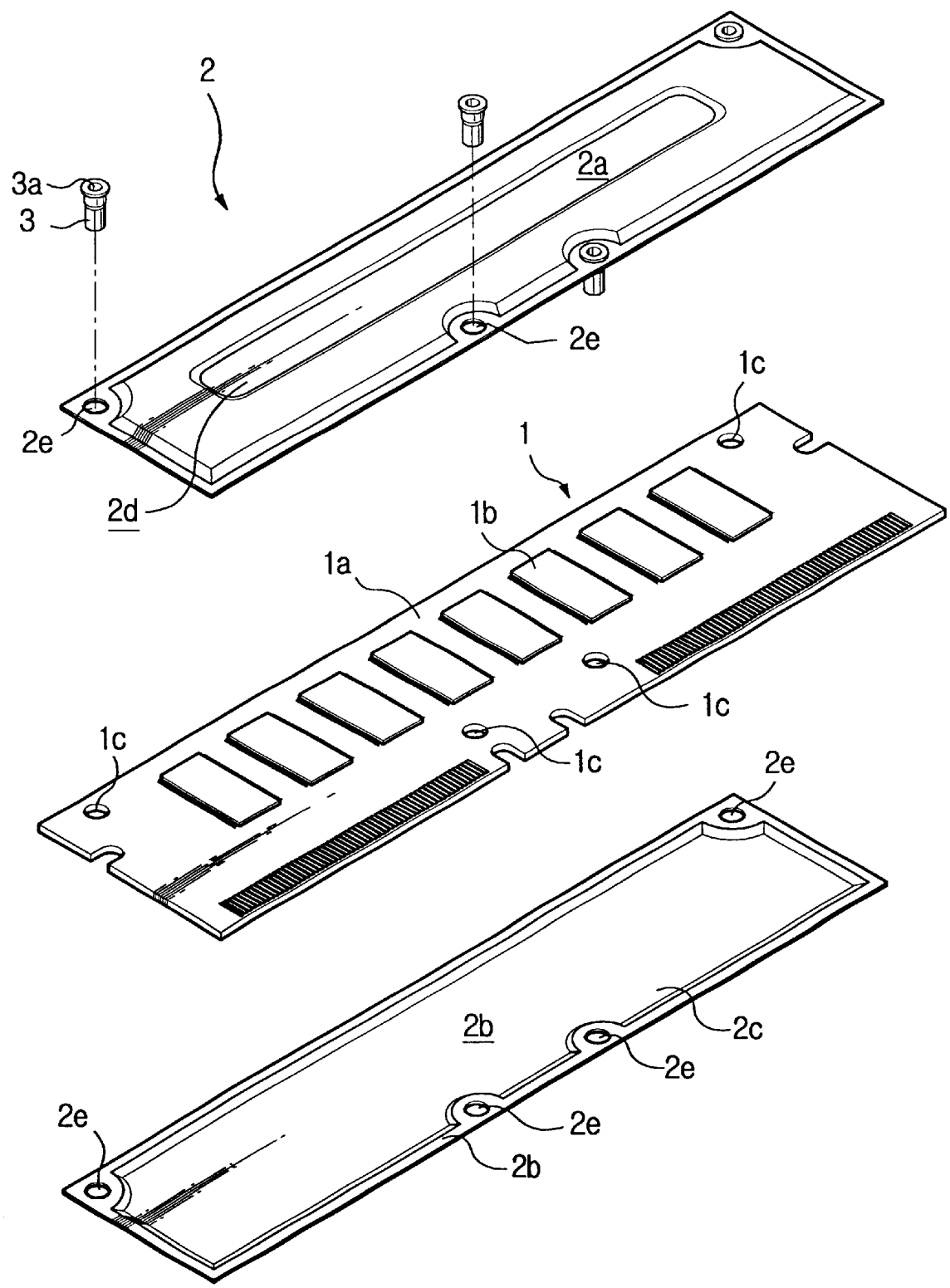
FIG. 1 is an assembly view of a heat sink connected to a semiconductor module.

FIG. 1 is an exploded perspective view of a semiconductor module and a heat sink assembled by equipment according to the present invention. Referring to FIG. 1, a semiconductor module 1 includes semiconductor chips 1b of wafer level mounted flip-chip style on one or both sides of a printed circuit board 1a having circuit patterns thereon. The semiconductor module 1 includes a plurality of through holes 1c at prescribed positions. The heat sinks 2a and 2b, which are on opposite sides of the printed circuit board 1a, have through holes 2e in a pattern matching the through holes 1c in the semiconductor module 1. The heat sinks 2a and 2b serve to protect the semiconductor chips 1b and quickly radiate heat generated in the semiconductor chips 1b. According to an aspect of the present invention, the semiconductor chips 1b are mounted on both sides of the printed circuit board 1a, and the heat sinks 2a and 2b are mounted on both sides of the printed circuit board 1a. One of two heat sinks 2a and 2b is referred to here as a first heat sink 2a, and the other is defined as a second heat sink 2b. The first and second heat sinks 2a and 2b are made in such a manner that rectangular plates of an aluminum alloy with an excellent thermal conductivity is hollowed by a press (not shown) to form a concave storage space 2c for the semiconductor chips 1b. The press, when working the first heat sink 2a, forms a labeling area 2d for attachment of a label for information associated with the semiconductor module 1. As noted above, the first and second heat sinks 2a and 2b include through holes 2e having the same size and positions as respective through holes 1c in the printed circuit board 1a. Rivets 3 to be coupled with the through holes formed in the second heat sink 2b and the printed circuit board 1a are initially mounted in the through holes 2e of the first heat sink 2a in a tight fit manner. The rivet 3 coupled to the first heat sink 2a is of conventional construction and mainly made of a metal that has excellent in ductility and workability and a prescribed strength. The rivet 3 has a through hole 3a perforating the inside thereof to improve the workability of the rivet 3.

Figure 2:
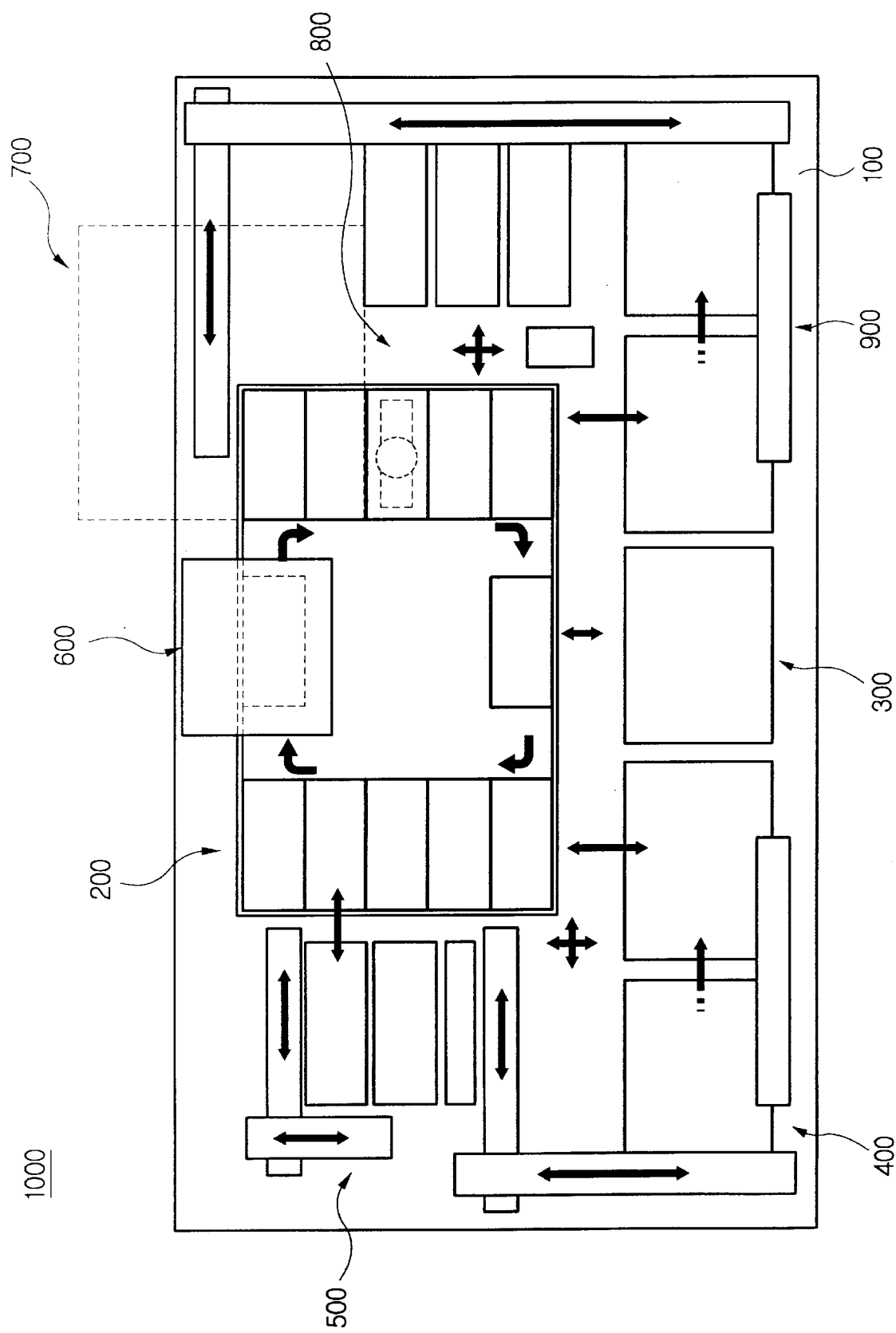
FIG. 2 is a block diagram of equipment for assembling the heat sinks and the semiconductor modules according to the present invention.
Figure 3:
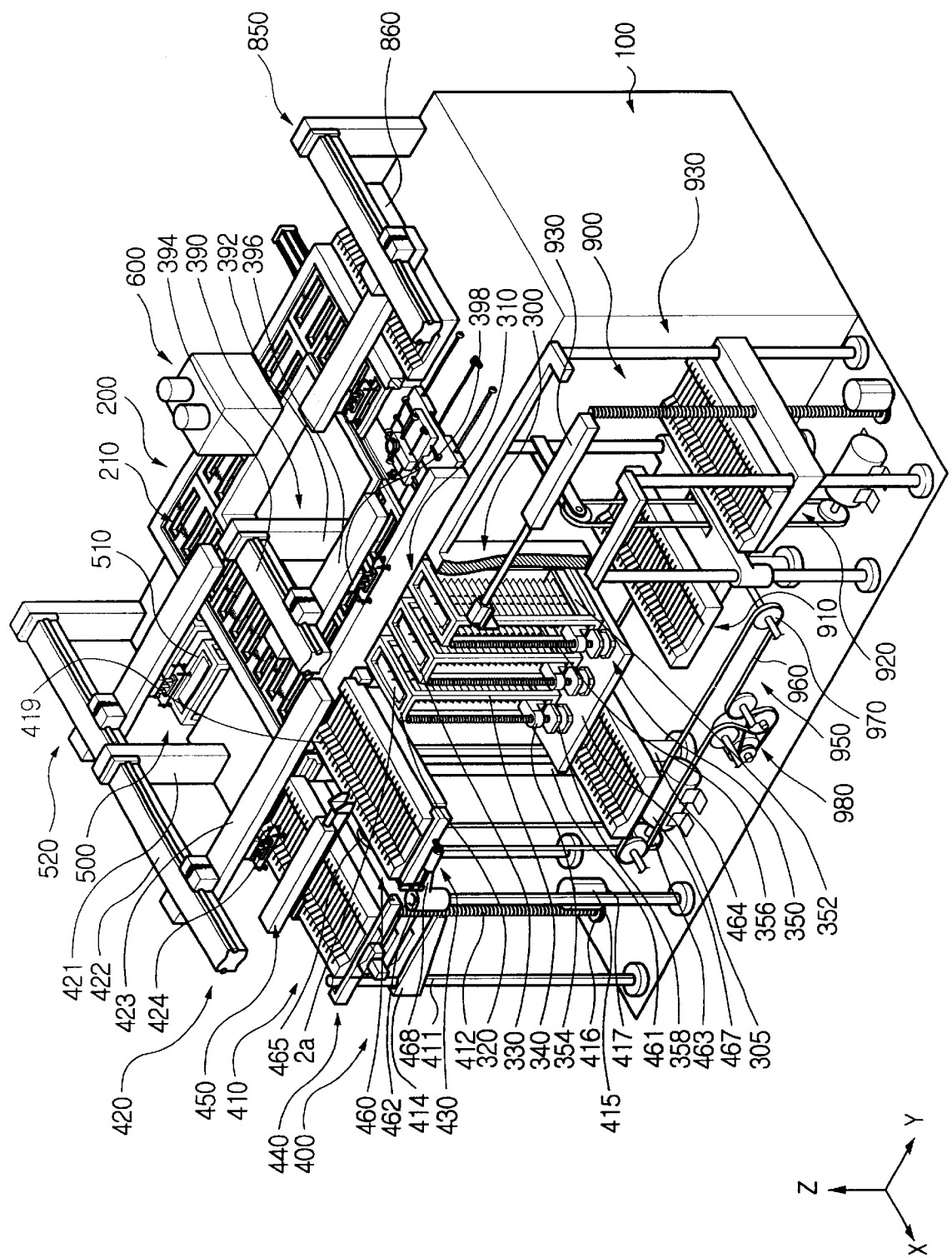
FIG. 3 is a perspective view showing the equipment of FIG. 2 in more detail.

FIG. 2 is a block diagram of the assembly and inspection equipment 1000 that fixes the heat sinks 2a and 2b to the printed circuit board 1a, labels the first heat sink 2a, and inspects the finished product. FIG. 3 is a perspective view showing the equipment 1000 of FIG. 2 in more detail. Referring to FIGS. 2 and 3, the assembly equipment 1000 generally includes a base body 100, a built-up pad conveying unit 200, a first heat sink supply unit 300, a semiconductor module unloading unit 400, a second heat sink supply unit 500, a rivet machine 600, a labeling device 700, a visual inspection unit 800, and a semiconductor product loading unit 900. In more detail, the built-up pad conveying unit 200 includes a rectangular frame disposed at the upper center of the base body 100. The first heat sink supply unit 300 is on a portion of the base frame 100 at the front of the built-up pad conveying unit 200. The semiconductor module unloading unit 400 is on a portion of the base body 100 separated from the first heat sink supply unit 300 along the direction of the Y-axis. The second heat sink supply unit 500 is beside the built-up pad conveying unit 200 and separate from the semiconductor module unloading unit 400 along the direction of the X-axis. The rivet machine 600 is on the upper portion of the built-up pad conveying unit 200 and separated from the second heat sink supply unit 500 along the direction of the Y axis. The labeling device 700 is inside the built-up pad conveying unit 200 and separated from the rivet machine 600 along the built-up pad conveying unit 200 and turned in the direction of the X-axis. The visual inspection unit 800, which moves in and out of the built-up pad conveying unit 200, is at a position separated in the direction of the X-axis from the labeling device 700. The semiconductor product loading unit 900 is on the base body 100 separated from the visual inspection unit 800.

Hereinafter, construction and functions of components of an exemplary embodiment of the assembly equipment 1000 is described in more detail.

The base body 100 is a hexahedral box having a prescribed height and serves to support and fix the other components described below.

The built-up pad conveying unit 200 is mounted and supported at the upper center of the base body 100.

The built-up pad conveying unit 200 shown in FIGS. 3 to 6 transfers built-up pads 210 from station to station circularly around a loop. At the stations, respective units assemble and attach the heat sinks and semiconductor modules and inspect finished product.

Figure 4:
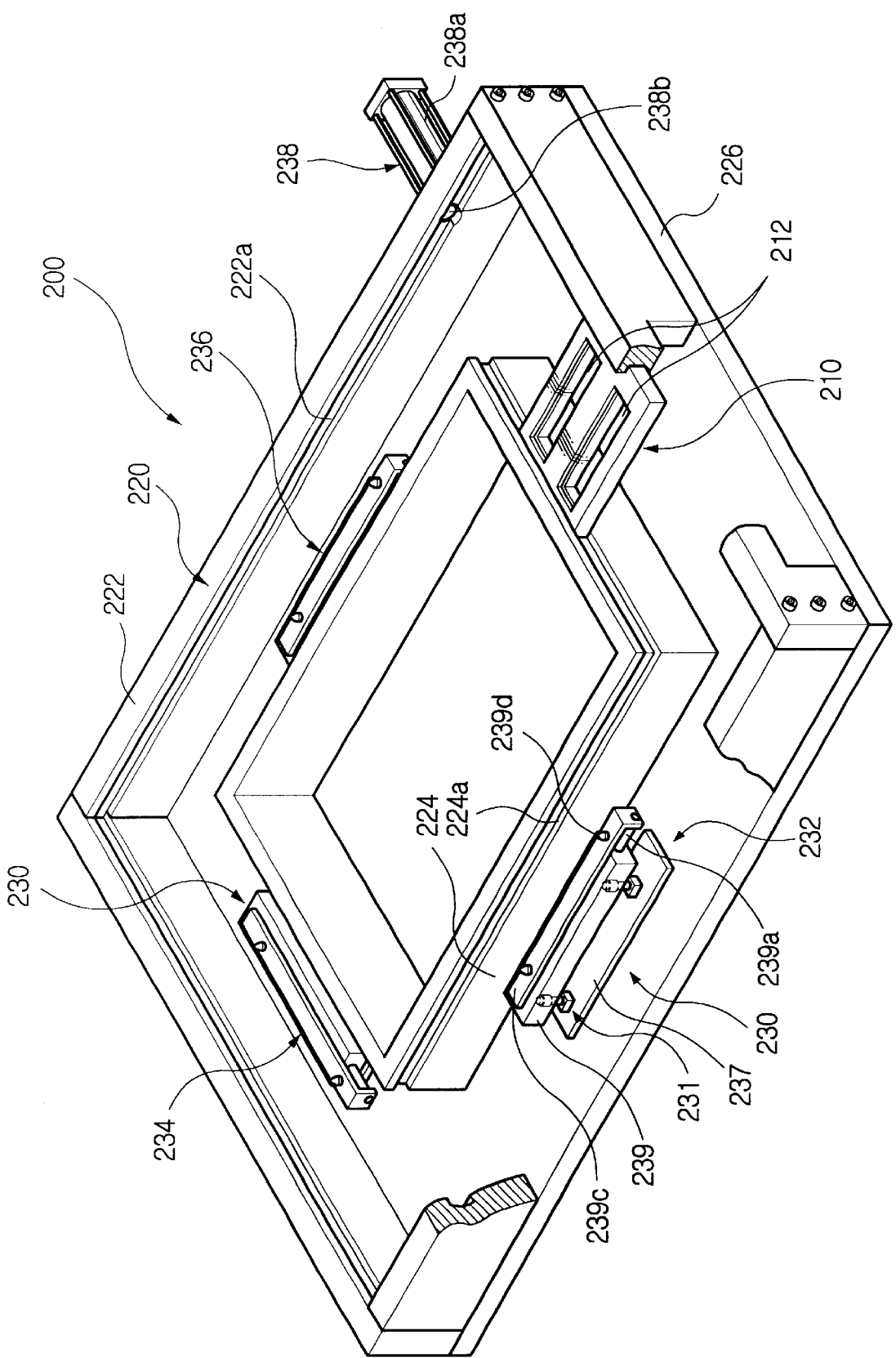
FIG. 4 is a perspective view, in partial section, of a built-up pad conveying unit according to the present invention.

As shown in FIG. 4, the built-up pad conveying unit 200 includes the built-up pads 210, a conveying body 220, and a plurality of conveying cylinders 230. The heat sinks and the semiconductor modules 1 are seated on the built-up pads 210. The conveying body 220 is rectangular and has guide grooves 222a and 224a that extend around the inside of the body. The built-up pads 210 have ends inserted into the guide grooves 222a and 224a and can slide along the guide grooves. A plurality of conveying cylinders 230 move the built-up pads 210 around a loop formed by the rectangular conveying body 220.

Figure 5:
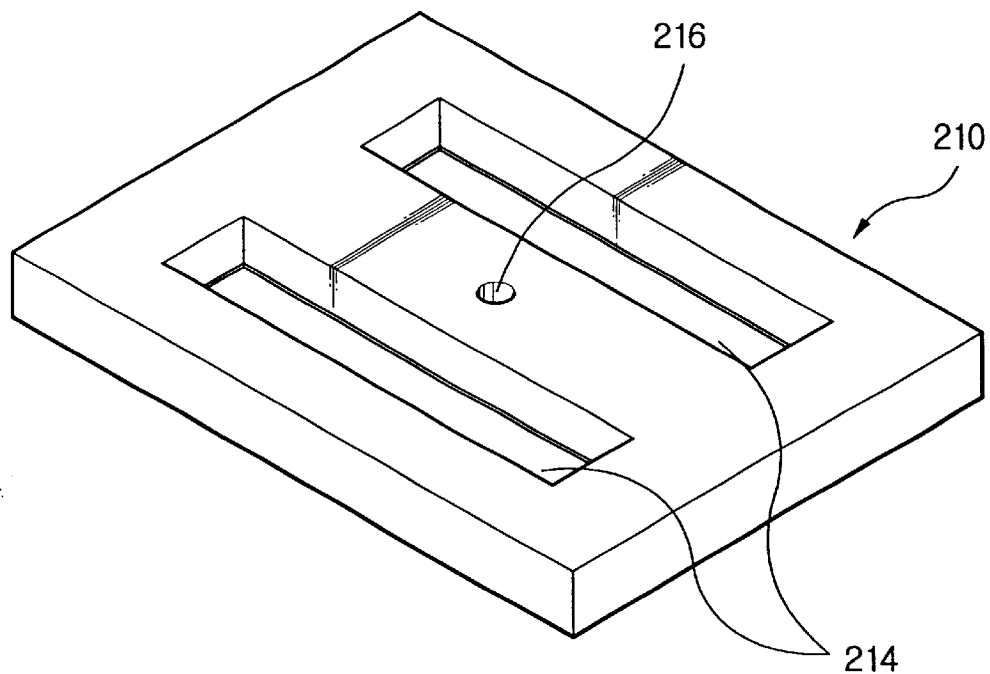
FIG. 5 is a rear view of a built-up pad according to the present invention.
Figure 6:
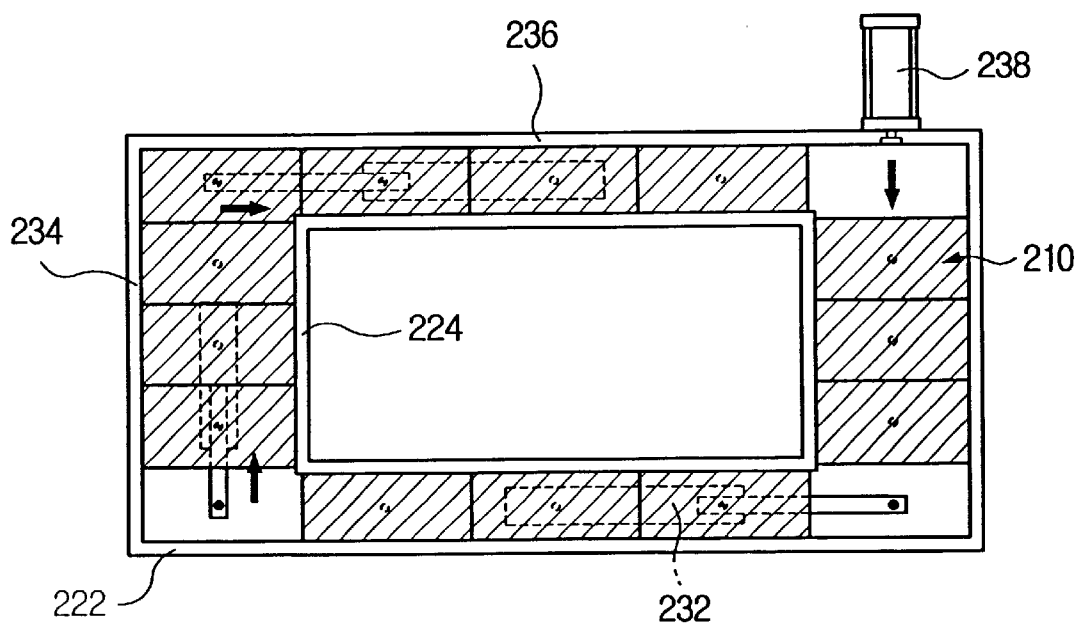
FIG. 6 illustrates the function of the built-up pad conveying unit according to the present invention.

Referring to FIGS. 4 and 5, each built-up pad 210 is a flat and rectangular plate having a prescribed thickness. FIG. 5 shows a perspective rear view of one built-up pad 210. The built-up pad 210 includes a storage groove 212 on a top side of the built-up pad 210. The storage groove has a depth suitable for storage of at least two of the heat sinks and a semiconductor module. Holes 214 are in the inside bottom surface of the heat sink storage groove 212 and perforate the built-up pad 210, as shown in FIG. 5, to permit attachment of a label on the first heat sink 2a. The heat sink storage groove 212 further includes rivet-supporting projections (not shown) that support the heads of the rivets 3 in the first heat sink 2a.

Referring to FIG. 4, the conveying body 220 includes first and second guide frames 222 and 224 that are parallel and separated from each other by a prescribed interval corresponding to the dimensions of the built-up pads 210. A bottom surface 226 of a rectangular plate type supports the guide frames 222 and 224. The first guide frame 222 is mounted along the edge of the bottom surface 226, and consists of four sidewalls having the same height. Each sidewall is connected perpendicularly to adjacent sidewalls, and thereby the first guide frame 222 forms a rectangular frame. The first guide frame 222 has the guide groove 222a formed on the inner surface of the first guide frame 222. The guide groove 222a preferably has a width larger than the thickness of the built-up pad 210 so that the built-up-pad 210 can be easily inserted into the guide groove 222a and can slide smoothly along the guide groove 222a.

The second guide frame 224, which has the same height as the first guide frame 222, is inside the first guide frame 222. The second guide frame 224 has a guide groove 224a formed in the outer surface thereof, and the guide groove 224a has the same height as the guide groove 222a in the first guide frame 222. The separation between the second guide frame 224 and the first guide frame 222 is such that the built-up pad 210 fits in the guide grooves 224a and 222a of the guide frames 222 and 224 and slides smoothly along the guide grooves 222a and 224a. When the built-up pad 210 is between the guide grooves 222a and 224a and two adjacent sides of the built-up pad 210 contact the guide groove 222a, a second edge formed by other two adjacent sides of the built-up pad 210 is preferably seated on the edge of the guide groove 224a, so that the built-up pad 210 remains in guide grooves 222a and 224a when moving around a corner of the guide body 220.

The number of built-up pads 210, which are inserted into the conveying body 220 having the above construction, is somewhat smaller than the maximum number of the built-up pads 210 which can simultaneously reside in the conveying body 220. Having few than the maximum number that would fit permits circular transfer the built-up pads 210 in a step-by-step manner, which is described below. Three conveying cylinders 230 (also referred to herein as first conveying cylinder 232, second conveying cylinder 234, and third conveying cylinder 236) are on the bottom surface 226 between the first and second guide frames 222 and 224. A fourth conveying cylinder 238 is on the outside of the first frame 222. Each conveying cylinder 230 or 238 transfers the built-up pads 210 in a straight line. Accordingly, at least four conveying cylinders are required to circularly transfer the built-up pads 210.

Each conveying cylinder 230 transfers the built-up pads 210 at a right angle to the adjacent conveying cylinders. Each of the first to third conveying cylinders 232, 234, and 236 includes a cylinder support 237 fixed on the bottom surface 226 of the conveying body 220. An up-down cylinder 231 is disposed on the cylinder supporter 237 and moves up and down parallel to the first and second guide frames 222 and 224. A cylinder 239 attached to the up-down cylinder 231 has a cylinder rod 239a which moves perpendicularly and has a horizontal displacement. A conveying rod 239c, which is connected to the cylinder rod 239a and moves in the direction of the displacement of the cylinder rod 239a, has a projection 239d. When the up-down cylinder 231 raises the cylinder 239, the projection 239d from the upper surface of the conveying rod 239c can engage a hole 216 in the built-up pad 210, permitting cylinder 239 to pull the built-up pad 210 along guide grooves 222a and 224a. Hole 216 is between the labeling holes 214 of the built-up pad 210, as shown in FIG. 5. The movement of the up-down cylinder 231 inserts the projection 239d into or releases the projection 239d from the hole 216 at the lower surface of the built-up pad 210.

When the up-down cylinder 231 inserts the projection 239d into the concave hole 216, the operation of the cylinder 239 displaces the cylinder rod 239a and the conveying rod 239c, which pushes the built-up pad 210 in the direction of the displacement. Referring to FIG. 4, the fourth conveying cylinder 238 differs from the first to third conveying cylinder 232, 234 and 236 in the components and the installation position. The fourth conveying cylinder 238 transfers the built-up pad 210 after the semiconductor module 1 and the first and second heat sinks 2a and 2b are connected and positions the built-up pad 210 for the visual inspection unit 800, which inspects the module enters under the built-up pad 210. According, mounting the fourth conveying cylinder 238 in the same manner as the first to third conveying cylinders 232, 234 and 236 would be difficult because such mounting would interfere with movement of visual inspection unit 800. For this reason, a cylinder body 238a is on the outer surface of the first guide frame 222 and moves the cylinder rod 238b, which extends through a hole in first guide frame 222, to push and transfer the built-up pads 210 in the step-by-step manner.

Around the built-up pad conveying unit 200, various units are mounted to supply and seat the first and second heat sinks 2a and 2b and the semiconductor module 1 in the built-up pad 210, rivet the first and second heat sinks 2a and 2b and the semiconductor module 1 together, attach the label to the first heat sink 2a, and inspect the assembly quality.

Referring to FIG. 3, as one embodiment, the first heat sink supply unit 300 is located in a storage space, which is made by a bottom plate 305 and side walls (not shown), at the front center of the base body 100. The bottom plate 305 is fixed at the front portion of the base body 100 that corresponds to the position of about ½ height of the base body 100.

The first heat sink supply unit 300 includes a first heat sink magazine 310 and a first heat sink conveying unit 390. The first heat sink magazine 310 includes a first heat sink storage frame 320 and a first heat sink elevator 350. The first heat sink storage frame has a hole 330 of the size corresponding to that of the first heat sink 2a and an elongated hole 340 formed longitudinally at the whole side surface and in which the first heat sinks 2a are piled. The first heat sink elevator 350 moves the pile of first heat sinks 2a up and down in the first heat sink storage frame 320.

The first heat sink elevator 350 extends from a first heat sink lift plate 352 supporting the first heat sink 2a positioned at the lowest part of the first heat sink storage frame 320. The first heat sink elevator 350 includes a bushing 354 having a female threaded part, a conveying screw 356 engaged with the bushing 354 and extending parallel with the first heat sink storage frame 320, and a motor 358 connected to rotate the conveying screw 356 to control precisely the height of the first heat sink lift plate 352.

As one embodiment, three first heat sink magazines 310 having the above structure are side by side, and multiple first heat sinks 2a with the rivets 3 inserted, are piled and stored in each of the first heat sink magazine 310. A first heat sink conveying unit 390 is on the upper portion of the base body 100 and reciprocates between the first heat sink supply unit 300 and the built-up pad conveying unit 200. Preferably, the first heat sink conveying unit 390 includes a support shaft 392, an X-axis conveying arm 394, a Y-axis conveying arm 396, and a pick-up module 398. The support shaft has one end fixed on the upper surface of the base body 100 and the other end extending from the base body 100 to the upper portion of the built-up pad conveying unit 200. The X-axis conveying arm 394 is mounted at the other end of the support shaft 392 and extends in the direction of the first heat sink supplying unit 300. The Y-axis conveying arm 396 connects perpendicularly to the X-axis conveying arm 394 and slides along the X-axis conveying arm 394 from the first heat sink supplying unit 300 to the built-up pad conveying unit 200. The pick-up module 398 is connected to the Y-axis conveying arm 396 and slides along the Y-axis conveying arm 396.

In more detail, the pick-up module 398 includes an up-down cylinder (not shown) moving up and down in the Z direction from the Y-axis conveying arm 396, a gripper (not shown) mounted on the up-down cylinder for gripping the first heat sink 2a and a rotary cylinder (not shown) for rotating the gripper on X and Y levels.

After a first heat sink 2a from the first heat sink conveying unit 390 is inserted into the built-up pad 210, the first conveying cylinder 232 of the built-up pad conveying unit 200 moves the built-up pad 210 one step forward in the clockwise direction. After that step, a semiconductor module 1 is connected to the first heat sink 2a stored in the built-up pad 210. For this operation, the semiconductor module unloading unit 400 is separated in the clockwise direction a prescribed interval from the first heat sink supply unit 300.

Referring to FIG. 3, the semiconductor module unloading unit 400 generally includes a tray loader 410, a semiconductor module conveying unit 420, and an empty tray unloader 430.

The tray loader 410 includes a pair of guide poles 411 separated from each other by a prescribed interval. Each guide pole 411 has one end fixed on the inner bottom surface of the base body 100 and the other end directed along the Z-axis. A motor 415 is fixed at a portion of the inner bottom surface of the base body 100, that is located between the guide poles 411, and has a motor shaft directed along the Z-axis. The motor shaft rotates a conveying screw 412 that engages a threaded bushing between the guide poles 411 and thereby slides a tray supporter 414 connected to the bushing. In more detail, the conveying screw 412 has a first spur gear 416 at one end thereof, and the end of the conveying screw 412 having the first spur gear 416 is pivotally connected on the inner bottom surface of the base body 100. Moreover, the first spur gear 416 connected with the conveying screw 412 is engaged with a second spur gear 417 (partially shown in the drawing) connected to the motor shaft of the motor 415 fixed on the bottom surface of the base body 100.

One or more trays 419 having a plurality of slots, each of which has the Y-axis direction of the coordinate system shown in FIG. 3 are on the tray supporter 414 of the tray loader 410 having the above structure. The semiconductor modules 1 inserted perpendicularly, are piled, and the piled trays 419 are transferred upward by the height of one tray in order. The semiconductor module conveying unit 420 loads a semiconductor module 1 from the tray 419 on the built-up pad 210 containing in the first heat sink 2a. The semiconductor module conveying unit 420 includes a support rod 421, an X-axis conveying arm 422, a Y-axis conveying rod 423, and a semiconductor module pick-up unit 424. The support rod 421 extends in the Z direction and has one end disposed on the upper surface of the base body 100. The X-axis conveying arm 422 is on the support rod 421 and extends in the X direction. The Y-axis conveying arm 423 slides along the X-axis conveying arm 422, and the semiconductor module pick-up module 424 slides along the Y-axis conveying arm 423.

The tray unloader 430 is between the first heat sink supply unit 300 and the tray loader 410 of the semiconductor module unloading unit 400. The tray unloader 430 transfers an empty tray after the tray loader 410 and the semiconductor module conveying unit 420 unloads all of the semiconductor modules 1 that were stored in the tray 419.

Figure 7:
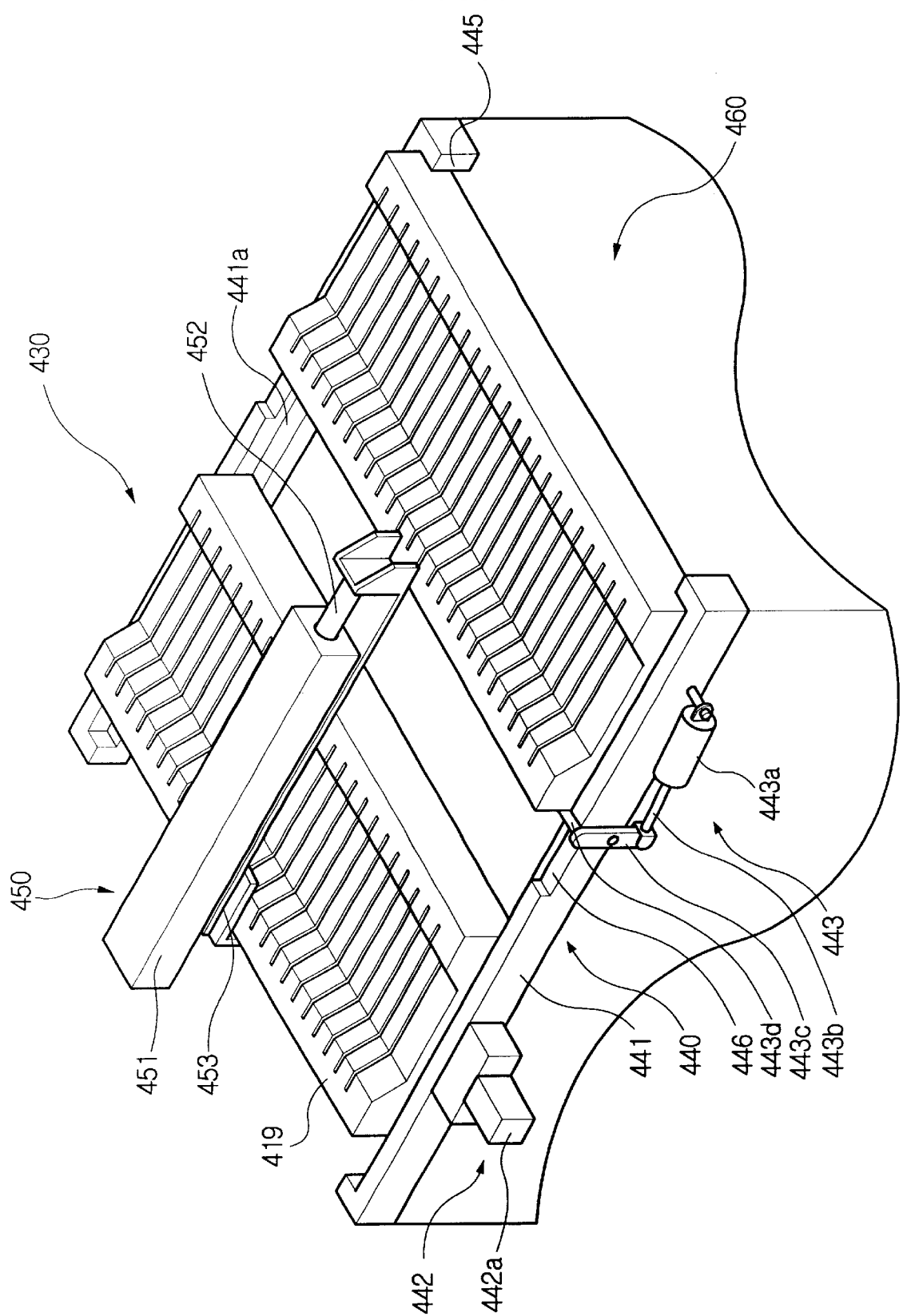
FIG. 7 is a perspective view of a tray conveying unit according to the present invention.

FIG. 7 shows the tray unloader 430 in more detail. The tray unloader 430 includes a tray conveying rail 440, a tray conveying cylinder 450 and a tray unloading elevator 460. The tray conveying rail 440 transfers the tray 419 to a tray unloading area. The tray conveying rail 440 generally includes a tray conveying rail body 441, a rail width adjusting cylinder 442, and a tray fixing cylinder 443. The tray conveying rail body 441 does not prevent the transfer of the tray 419 when the tray 419 storing the semiconductor modules is transferred from the tray loader 410 to the upper portion of the base body 100. The tray conveying rail body 441 does, however, prevent the fall of the tray 419 by supporting the tray 419 when the empty tray is unloaded.

In an exemplary embodiment, two tray conveying rail bodies 441 are provided, and each of them has a projection 445 formed to prevent the tray 419 from being transferred beyond a prescribed range. The interval between the tray conveying rail bodies 441 may be changed. The tray conveying rail body 441 has a concave hole 446 formed at the center thereof and having prescribed depth and width. The concave hole 446 is described further below.

At opposed side edges of the tray conveying rail bodies 441, stepped portions 441a are under the bottom surface of the tray 419 so as to guide the tray 419. The rail width adjusting cylinder 442, which has a cylinder body 442a is fixed on the base body 100 and a cylinder rod fixed on the tray conveying rail body 441, can adjust the width of the tray conveying rail bodies 441.

The tray fixing cylinder 443 is at the center of the tray conveying rail body 441 to stably fix the empty tray after the empty tray is transferred. The tray fixing cylinder includes a cylinder body 443a hinged at the outer surface of the tray conveying rail body 441, a cylinder rod 443b mounted on the cylinder body 443a, a rotary link 443c in the form of a bar, which is hinged on one end of the cylinder rod 443b and hinged on the tray conveying rail body 441 at the center portion thereof, and a pusher rod 443d mounted at one end of the rotary link 443c.

The pusher rod 443d is inserted into the concave hole 446 of the tray conveying rail body 441 and serves to closely contact the empty tray with the projection 445 of the tray conveying rail body 441 while rotating according to the displacement of the cylinder rod 443b.

To forcedly transfer the empty tray 419, which is supported by the tray conveying rail bodies 441, from the tray, in which the semiconductor modules are stored, piled under the empty tray, the tray conveying cylinder 450 is required.

The tray conveying cylinder 450 includes a cylinder body 451 fixed on the base body 100 at one end thereof, a cylinder rod 452 having the displacement generated by the cylinder body 451, and a tray pusher 453 mounted on the cylinder rod 452.

The tray pusher 453 has one end fixed on the cylinder rod 452 and the other end in contact with the rear surface of the tray 419 to transfer the tray 419 along the tray conveying rail body 441.

The empty tray 419, from which the semiconductor modules are all unloaded by the tray conveying cylinder 450, is transferred along the tray conveying rail bodies 441 to the ends of the tray conveying rail bodies 441.

To transfer the empty tray from the end of the tray conveying trail bodies 441, the tray unloading elevator 460 is mounted under the empty tray.

Referring again to FIG. 3, the tray unloading elevator 460 includes guide rods 461, a bushing 462, a motor 467, a driving pulley 463, a slave pulley 465, and a support rod 464. Guide rods 461 extend from the inner bottom surface of the base body 100 in the Z direction and are separated in a prescribed interval from each other. The bushing 462 is between and slides on the guide rods 461. The motor 467 lies on a portion of the bottom surface of the base body between the guide rods 461 and has a motor shaft facing the direction of the Y-axis. The driving pulley 463 is mounted on the motor shaft of the motor 467. The slave pulley 465 is mounted in a prescribed interval from the driving pulley 463 in the direction of the Z-axis through the medium of the upper surface of the base body 100, and a tension belt connects the driving pulley 463 and the slave pulley 465. An empty tray supporter 468 is fixed on the tension belt and the bushing 462. The support rod 464 is mounted under the empty tray supporter 468 to make the empty tray supporter 468 be located on a position separated from the bottom surface of the base body 100. The empty tray supporter 468 is smaller in the area than the empty tray, and thereby both end portions of the empty tray project somewhat from the empty tray supporter 468. The semiconductor module unloading unit 400 places each semiconductor module 1 on a first heat sink 2a stored in the built-up pad 210 with the rivets of the first heat sink 2a through the holes in the semiconductor module 1. The built-up pad conveying unit 200 moves the built-up pad 210 one step forward. The second heat sink supply unit 500 then provides the built-up pad with the second heat sink 2b.

The second heat sink supply unit 500 includes a second heat sink magazine 510 and a second heat sink conveying unit 520. Here, the second heat sink magazine 510 and the second heat sink conveying unit 520 have the same construction and substantially the same function as the first heat sink magazine 310 and the first heat sink conveying unit 398. Therefore, the detailed description of the second heat sink magazine 510 and the second heat sink conveying unit 520 will be omitted.

Figure 8A:
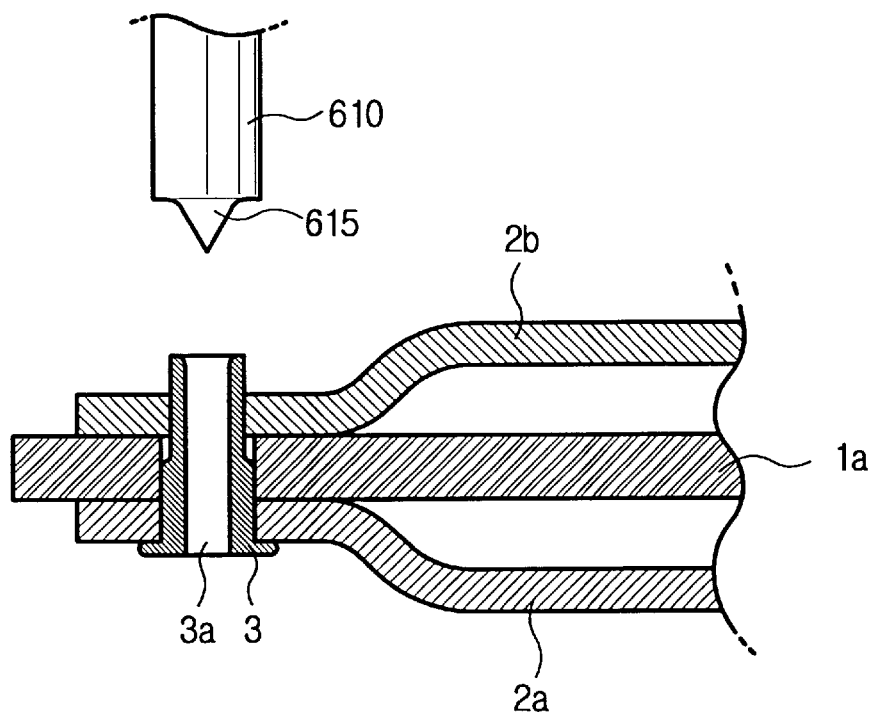
FIGS. 8A, 8B, 8C, and 8D are cross-sectional views illustrating the fixing of a first heat sink, the semiconductor module, a second heat sink with a rivet by a rivet machine.
Figure 8B:
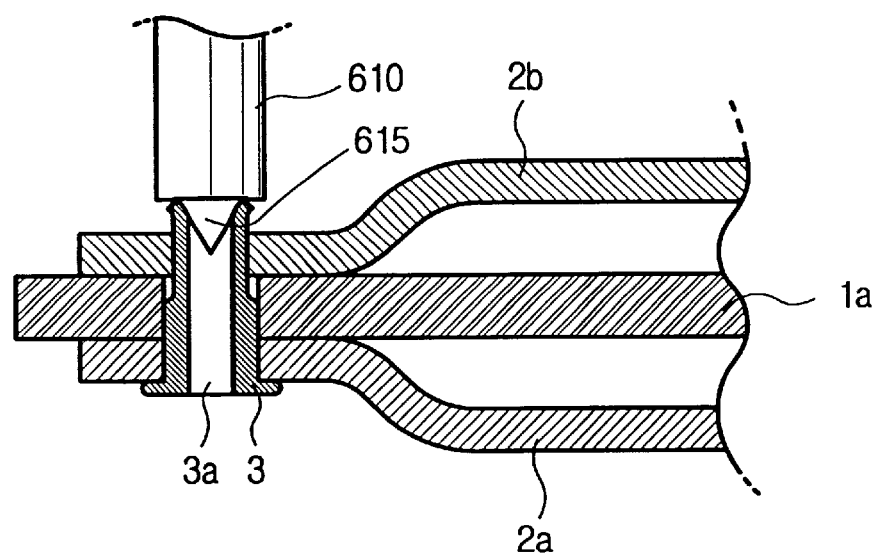

As shown in FIG. 8A, when the second heat sink 2b is seated on the built-up pad 210, the rivets 3 of the first heat sink 2a, which perforate the semiconductor module 1, are inserted through holes in the second heat sink 2b. After the second heat sink 2b is seated on the built-up pad 210, the built-up pad conveying unit 200 moves the built-up pad 210 another step forward to transfer the built-up pad 210 to the rivet machine 600.

The rivet machine 600 is illustrated in FIG. 3 or FIGS. 8A, 8B, and 8C generally. The rivet machine 600 includes a rivet pin 610, a rivet pin block (not shown) in which the rivet pin 610 is disposed, and a rivet pin up-down unit (not shown) for vertically reciprocating the rivet pin block. In more detail, the rivet pin 610 has a cylindrical shape and a rivet expanding projection 615 formed at an end thereof. Downward movement of the rivet pin 610 inserts the rivet expanding portion into hole 3a in the rivet 3 and expands the area of the end portion of the rivet 3 as the rivet pin 610 moves further downward. The rivet pin block further includes a pusher pin (not shown) that presses the second heat sink 2b before the rivet pin 610 reaches the rivet 3 to restrict the minute movement of the second heat sink 2b.

Referring to FIGS. 8A to 8D, a riveting process will be described briefly. First, a rivet up-down unit moves the rivet pin 610 toward the built-up pad 210 and inserts the rivet expanding projection 615 of the rivet pin 610 into the through hole 3a in the rivet 3, and thereby the through hole 3a of the rivet 3 starts to expand.

Figure 8C:
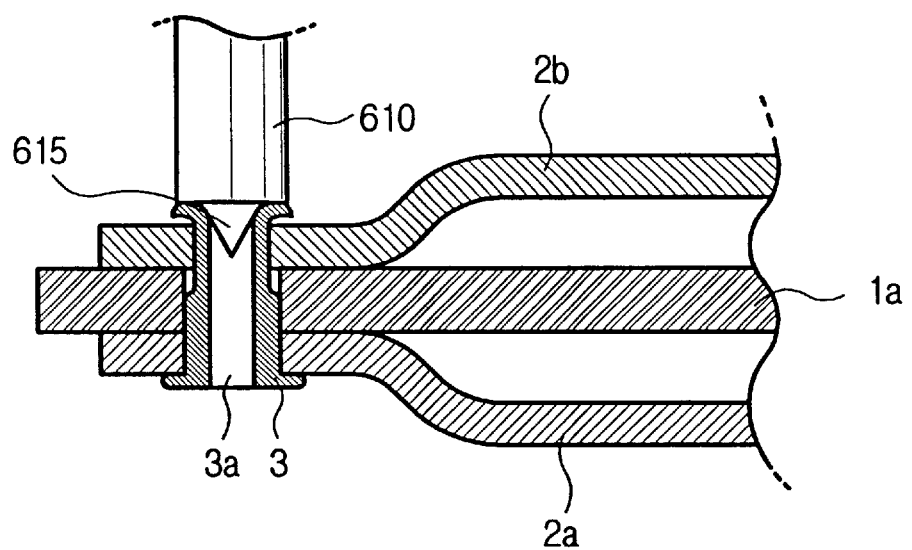
Figure 8D:
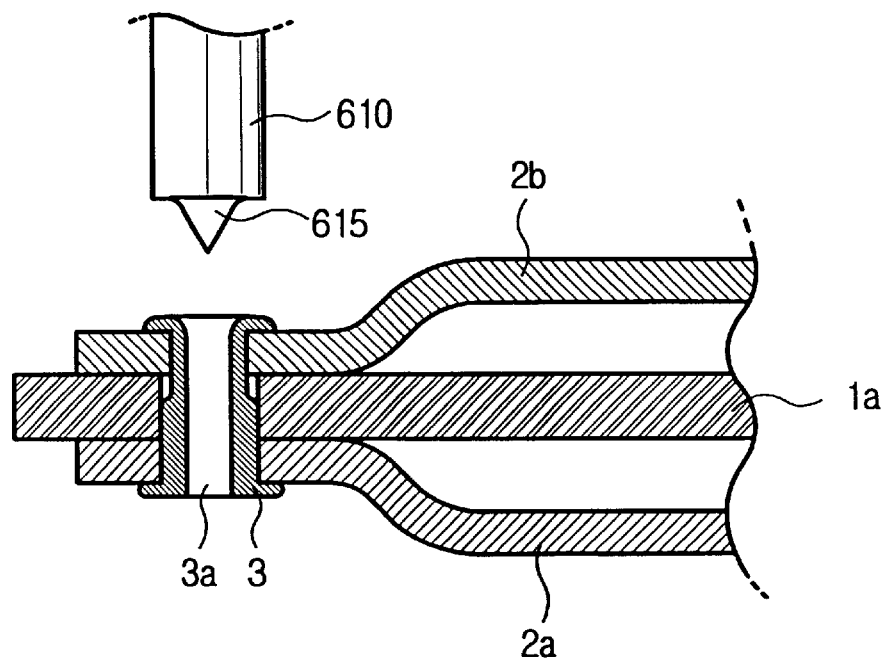

Subsequently, as shown in FIG. 8C, the rivet 3 having the through hole 3a expanded by the rivet expanding projection 615 turns inside out along the end of the rivet pin 610. As shown in FIG. 8D, the deformed rivet 3 applies pressure to the upper surface of the second heat sink 2b to fix the heat sinks 2a and 2b to the semiconductor module 1.

After the rivet machine 600 deforms the rivet 3 to fix the second heat sink 2b, the built-up pad conveying unit 200 moves the built-up pad 210 one step forward, and the label, on which information regarding the product is written, is attached on the first heat sink 2a.

Preferably, the labeling device is mounted on the inner bottom surface of the built-up pad conveying unit 200 and includes a label printer and a labeling unit.

Figure 9:
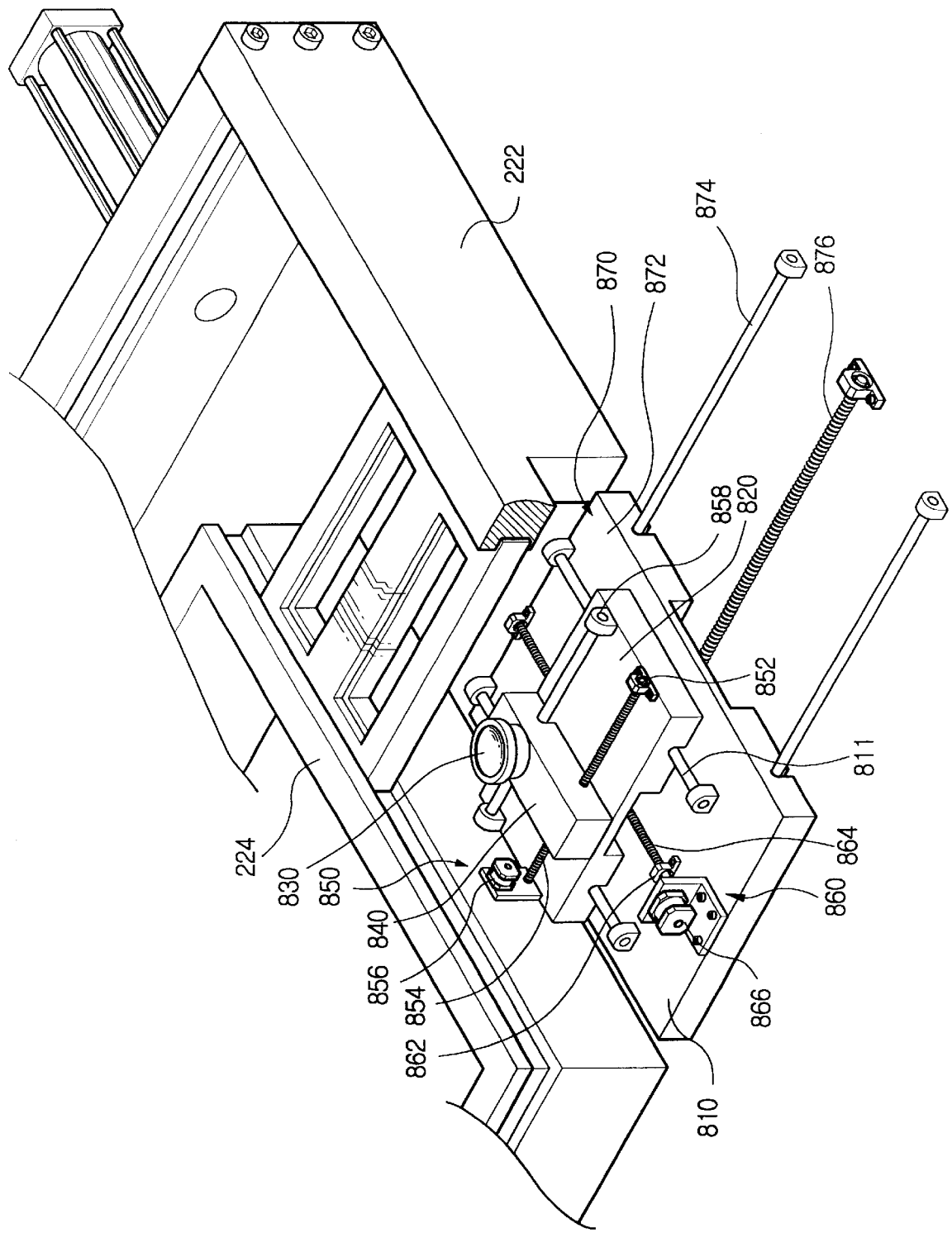
FIG. 9 is a perspective view showing a visual inspection unit according to an embodiment of the present invention.

The label printer serves to print product information on a label. The label printer separates the printed label from a sheet and discharges the printed label. When the label is discharged from the label printer, the adhesive surface of the label faces the first heat sink 2a. A pusher having a vacuum pad picks up the discharged label and attaches the label to the first heat sink 2a through the labeling hole 214 formed in the built-up pad 210. To inspect whether the labeling device properly attached the label, the visual inspection unit 800 takes a position separated by a prescribed interval from the labeling device, in the direction that the built-up pad 210 is transferred. FIG. 9 shows an embodiment of the visual inspection unit 800. The visual inspection unit 800 includes a first visual inspection unit board 810, a second visual inspection unit board 820, a visual unit 830, a visual unit fixing block 840, first and second driving units 850 and 860 for driving the visual unit fixing block 840, and a visual inspection unit conveying unit 870.

The visual inspection unit conveying unit 870 includes a conveying plate 872 extending from the inside of the built-up pad conveying unit 200 to the outside, a pair of guide rails 874 mounted at the lower surface of the conveying plate 872 to transfer the conveying plate 872, a conveying screw 876 screwed to a bushing projected from the conveying plate 872, and a motor (not shown) for driving the conveying screw 876. The first guide frame 222 has an opening to allow the conveying plate 872 to move in and out through the first guide frame 222.

On the upper surface of the conveying plate 872, a pair of guide rails 811, which extend in the direction that the built-up pad 210 is transferred, are arranged at a prescribed interval from each other. The guide rails 811 are connected on the lower surface of the second visual inspection unit board 820 in a slide manner.

A first driving unit 860 is mounted on the upper surface of the first visual inspection unit board 810 connected to the guide rails 811, and a second driving unit 850 is mounted on the upper surface of the second visual inspection unit board 820.

The first driving unit 860 includes a bushing 862 formed between the first and second visual inspection unit boards 810 and 820, a conveying screw 864 and a motor 866. In more detail, the bushing 862 having a female threaded part is at the lower surface of the second visual inspection unit board 820, and the conveying screw 864 engages the bushing 862.

The conveying screw 864 is connected with a shaft of the motor 866, and thereby the second visual inspection unit board 820 reciprocates along the guide rails 811. The first driving unit 860 is used to inspect the labels attached on two first heat sinks 2a stored parallel in the built-up pad 210.

Meanwhile, the second driving unit 850 is mounted on the upper surface of the second visual inspection unit board 820 and serves to move the visual unit 830 at a right angle to the movement direction of the first visual inspection unit board 810.

The second driving unit 850 includes a conveying screw 854 disposed on the upper surface of the second visual inspection unit board 820 at a right angle to the conveying screw 864 of the first driving unit 860, a bushing 852 supporting both ends of the conveying screw 854, a driving motor 856 mounted at one end of the conveying screw 854, and guide rails 858 arranged at one or both sides of the conveying screw 854 and running parallel to the conveying screw 854. The visual inspection unit block 840 is connected to the guide rails 858 in a slide manner and engaged with the conveying screw 854.

The second driving device 850 allows the visual inspection unit 800 to inspect the label while moving along the label attached on each first heat sink 2a stored in the built-up pad 210.

The semiconductor product conveying unit 850 picks up the semiconductor product having the heat sink inspected by the visual inspection unit 800 and transfers the product to a rework tray 860 or the empty tray provided for the semiconductor product loading unit 900. The rework tray 860 receives product that did not pass the visual inspection. The empty tray receives good product.

The semiconductor product loading unit 900 generally includes an empty tray loader 910, a tray unloader 920, and a tray conveying unit 930. After a tray is filled with semiconductor product having attached heat sinks, the tray conveying unit 930 transfers the tray from the empty tray loader 910 to the tray unloader 920. The tray unloader 920 receives and removes the filled trays.

The semiconductor product loading unit 900 is disposed symmetrically to the semiconductor module unloading unit 400 on the basis of the first heat sink supply unit 300 and has the same construction as the semiconductor module unloading unit 400. Therefore, the detailed description of the semiconductor product loading unit 900 will be omitted. As the semiconductor module unloading unit 400 continuously discharges the empty trays from which the semiconductor modules are all unloaded, the semiconductor product loading unit 900 requires the empty trays to load the semiconductor products. The empty trays discharged from the semiconductor module unloading unit 400 are transferred to the semiconductor product loading unit 900 directly.

In particular, a tray belt conveying unit 950 extends from the lower portion of the tray unloader 430 of the semiconductor module unloading unit 400 to the lower portion of the tray loader 910 of the semiconductor product loading unit 900. The tray belt conveying unit 950 generally includes a loop type tray conveying belt 960 forming a prescribed space to seat the empty tray, a pulley 970 mounted both sides of the tray conveying belt 960 to drive the tray conveying belt 960 and a driving unit 980 mounted at the center of the tray conveying belt 960 to apply a proper tension to the tray conveying belt 960 and to drive the tray conveying belt 960.

Referring to the drawings, a method for assembling the heat sink to the semiconductor module according to the present invention will be described as follows.

First, the first heat sinks 2a, the trays storing the semiconductor modules 1 and the second heat sinks 2b are respectively stored and piled in the first heat sink storage frame 320 of the first heat sink supply unit 300, the semiconductor module supply unit 400 and the second heat sink magazine 510. Subsequently, the first heat sink conveying unit 390 seats the first heat sinks 2a from the first heat sink supply unit 300 in the multiple storage grooves 212 formed in the upper surface of the built-up pads 210 of the built-up pad conveying unit 200.

The built-up pad conveying unit 200 moves the built-up pad 210 one step forward and transfers the built-up pad 210 to a place adjacent to the semiconductor module supply unit 400. The semiconductor module supply unit 400 takes semiconductor modules from the tray and seats semiconductor module on each first heat sink 2a in the built-up pad 210. In seating a semiconductor module, the rivets 3 already in the first heat sink 2a are inserted in the holes 1c through the semiconductor module 1.

After seating of the semiconductor module 1 on the first heat sink 2a, the built-up pad conveying unit 200 transfers the built-up pad 210 another step, and the second heat sink supply seats a second heat sink 2b on each semiconductor module 1 in the built-up pad. This seating inserts the rivets 3 of the first heat sink 2a into the through holes 2e of the second heat sink 2b.

After that, the built-up pad conveying unit 200 moves the built-up pad with the assembled the first heat sink 2a, the semiconductor module 1 and the second heat sink 2b one step forward to the rivet machine 600. The rivet pin 610 of the rivet machine 600 deforms the rivet 3 of the first heat sink 2a and thereby firmly connects the second heat sink 2b, the semiconductor module 1 and the first heat sink 2a.

After that, the built-up pad conveying unit 200 moves the built-up pad 210 another step forward to the labeling unit. The label printed in the label printer is attached on the first heat sink 2a, and the built-up pad is transferred to the visual inspection unit 800. The visual inspection unit 800 inspects whether the rivet 3 is riveted exactly and the label is attached in the designated position. After the inspection, the bad semiconductor modules 1 are transferred to the rework tray, and the good semiconductor products are transferred to the semiconductor product loading unit 900.

As previously described, according to the present invention, the assembly process of the heat sink radiating heat generated from the semiconductor modules can be automated and performed consecutively.

Moreover, after the semiconductor modules are all unloaded from a tray, the empty tray is transferred to where the semiconductor products having the attached heat sinks are loaded, so that the loading/unloading of the tray can be automated.

While the present invention has been described with reference to the particular illustrative embodiments, it is not to be restricted by the disclosed embodiments but only by the appended claims. It is to be appreciated that those skilled in the art can change or modify the embodiments without departing from the scope and spirit of the present invention.

What is claimed is:

1. Equipment for attaching heat sinks to semiconductor modules, the equipment comprising:

a base body;

a built-up pad conveying unit mounted at the upper center of the base body, the built-up pad conveying unit having a plurality of built-up pads;

a first heat sink supply unit that seats the first heat sink, from which a rivet is projected, on a built-up pad at a corresponding station of the built-up pad conveying unit;

a semiconductor module unloading unit that seats the semiconductor module with the rivet through a hole in the semiconductor module after the built-up pad, on which the first heat sink is seated, is transferred one step;

a second heat sink supply unit that seats a second heat sink with the rivet through a hole in the second heat sink, after the built-up pad, on which the combined first heat sink and semiconductor module are seated, is transferred another step;

a riveting unit that works an end of the rivet of the first heat sink after the built-up pad with the first heat sink, the semiconductor module, and the second heat sink is transferred another step;

a semiconductor product loading unit that loads the semiconductor products, which are connected to the first and second heat sinks after the riveting of a rivet machine, on a tray; and a tray conveying unit for transferring the tray from the semiconductor module unloading unit to the semiconductor product loading unit.

2. The equipment as claimed in claim 1, wherein the built-up pad includes a heat sink storage groove formed at one side thereof to store at least one or more the first heat sinks and a pulling means formed at the other side to pull the built-up pad.

3. The equipment as claimed in claim 2, wherein the built-up pad conveying unit comprises:

a first guide sidewall having a guide groove, the first guide sidewall having a shape to transfer the built-up pads circularly, one end of the built-up pad being inserted into the guide groove and supported in a slide manner;

a second guide sidewall in which another end of the built-up pad is inserted and supported in a slide manner; and a conveying cylinder connected to the built-up pad to allow the built-up pad to be pulled along the guide groove.

4. The equipment as claimed in claim 3, wherein the conveying cylinder is mounted on the upper surface of the base body, which is located between the first guide sidewall and the second guide sidewall, and the conveying cylinder comprises:

a cylinder having a cylinder rod generating a horizontal displacement and a cylinder body providing the horizontal displacement to the cylinder rod;

a conveying rod mounted on the cylinder rod, the conveying rod having a connection means coupled to the pulling means; and an up-down cylinder having an end mounted on the cylinder body to couple or separate the pulling means to or from the coupling means.

5. The equipment as claimed in claim 1, wherein the first and second heat sink supply units comprises respective heat sink magazines and each of the heat sink magazines comprises:

a heat sink magazine body having a heat sink storage space for storing and piling the heat sinks and holes formed in the upper surface and the side surface; a heat sink lift plate mounted inside the heat sink magazine body, the heat sinks being piled on the heat sink lift plate; a conveying screw screwed into the heat sink lift plate, the conveying screw generating displacement to the heat sink lift plate;

a heat sink elevator having a motor connected to the conveying screw; and heat sink conveying units, each of which is mounted on the upper surface of the base body, the heat sink conveying unit transferring the heat sinks stored in the heat sink magazine body to the built-up pads.

6. The equipment as claimed in claim 1, wherein the semiconductor module unloading unit comprises:

a tray loader for piling and moving up and down trays, in which the semiconductor modules connected with the heat sinks are stored, in a storage space provided inside the base body; and an empty tray loader mounted near the tray loader to pile empty trays after the semiconductor modules are all unloaded from the trays piled on the tray loader; and a tray conveying unit for transferring the trays from the tray loader to the empty tray loader.

7. The equipment as claimed in claim 6, wherein the tray conveying unit comprises:

a tray conveying rail body separated with width larger than that of the tray or with width smaller than that of the tray; and a width adjusting cylinder having an end fixed on the base body and the other end mounted on the tray conveying rail body, the width adjusting cylinder varying the interval between tray conveying rails.

8. The equipment as claimed in claim 1, wherein a labeling device for attaching a label on one of the first and second heat sinks riveted by a rivet machine is mounted at a place adjacent to the rivet machine.

9. The equipment as claimed in claim 8, wherein a visual inspection unit is mounted at a place adjacent to the labeling device to inspect the quality of the label attached on one of the heat sinks and to inspect the quality of the worked rivet, and the visual inspection unit comes in and out the built-up pad conveying unit to inspect the labeling quality inside the built-up pad conveying unit and to inspect the quality of the rivet outside the built-up pad conveying unit.

10. The equipment as claimed in claim 9, wherein a semiconductor product loading unit, which is mounted near the visual inspection unit, comprises:

a tray loader for piling and moving up and down the empty trays in the storage space provided inside the base body after the semiconductor modules are all unloaded from the semiconductor module unloading unit;

a tray unloader for receiving and piling the trays, on which the semiconductor modules are stored, piled on the tray loader; and a tray conveying unit for transferring the trays from the tray loader to the tray unloader.

11. The equipment as claimed in claim 1, wherein the tray conveying unit is a belt conveying unit, one of which is located at the tray unloader of the semiconductor module unloading unit and the other of which transfers the trays by a belt extending to the tray loader of the semiconductor product loading unit.

12. A method for assembling heat sink to semiconductor module, the method comprising:

seating a first heat sink, on which a rivet is mounted, on a pad of a pad conveying unit and transferring the pad one step;

seating a semiconductor module transferred from a tray on the first heat sink on the pad and transferring the pad another step, wherein this seating inserts the rivet of the first heat sink through a hole in the semiconductor module;

seating a second heat sink on the semiconductor module that is on the pad and transferring the pad another step, wherein this seating inserts the rivet of the first heat sink through a hole in the second heat sink;

deforming an end of the rivet of the first heat sink on the transferred pad to fix the first and second heat sinks on the semiconductor module to form a semiconductor product and transferring the pad another step; and unloading the semiconductor product, which are located on the pad, onto empty tray after unloading all of the semiconductor modules from the tray.

13. The method as claimed in claim 12, further comprising attaching a label on one of the first and second heat sinks, after fixing the heat sinks on the semiconductor module, and transferring the pad after attaching the label.

14. The method as claimed in claim 13, further comprising inspecting the semiconductor products by a visual inspection unit and selecting bad semiconductor products and good semiconductor products and storing the good and bad semiconductor products in different places respectively.

15. Equipment for attaching heat sinks to semiconductor modules, the equipment comprising:

a pad conveying unit having a plurality of pads, the pad conveying unit forming a loop around which the pads move;

a first heat sink supply unit that seats one or more first heat sinks on each pad, when the pad is at a first position on the loop;

a semiconductor module unloading unit that seats a semiconductor module on each first heat sink on a pad, when the pad is at a second position on the loop;

a second heat sink supply unit that seats a second heat sink on each semiconductor module on a pad, when the pad is at a third position on the loop;

a riveting unit that rivets together each combination of a first head sink, a semiconductor module, and a second heat sink on a pad that is in a fourth position on the loop to thereby form one or more semiconductor products;

a semiconductor product loading unit that loads the semiconductor products from a pad that is in a fifth position on the loop; and a tray conveying unit that transfers empty trays from the semiconductor module unloading unit to the semiconductor product loading unit.

* * * * *